US008524398B2

(12) United States Patent
Holme et al.

(10) Patent No.: US 8,524,398 B2
(45) Date of Patent: Sep. 3, 2013

(54) ALL-ELECTRON BATTERY HAVING AREA-ENHANCED ELECTRODES

(75) Inventors: Timothy P. Holme, San Francisco, CA (US); Friedrich B. Prinz, Woodside, CA (US); Takane Usui, Palo Alto, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 524 days.

(21) Appl. No.: 12/798,102

(22) Filed: Mar. 29, 2010

(65) Prior Publication Data

US 2010/0255381 A1 Oct. 7, 2010

Related U.S. Application Data

(60) Provisional application No. 61/211,746, filed on Apr. 1, 2009, provisional application No. 61/211,745, filed on Apr. 1, 2009, provisional application No. 61/274,866, filed on Aug. 20, 2009.

(51) Int. Cl.
*H01M 2/00* (2006.01)
*H01G 4/33* (2006.01)

(52) U.S. Cl.
USPC .......................................... 429/246; 361/303

(58) Field of Classification Search
USPC .................. 429/246; 361/303; 977/755, 762, 977/774
See application file for complete search history.

(56) References Cited

U.S. PATENT DOCUMENTS

| | | | |
|---|---|---|---|
| 5,414,588 A | 5/1995 | Barbee, Jr. et al. | |
| 5,906,670 A | 5/1999 | Dobson et al. | |
| 6,060,743 A | 5/2000 | Sugiyama et al. | |
| 6,137,192 A | 10/2000 | Staffiere | |
| 6,137,671 A | 10/2000 | Staffiere | |
| 6,477,035 B1 | 11/2002 | Cepas et al. | |
| 6,830,971 B2 | 12/2004 | Balakumar et al. | |
| 6,867,449 B2 | 3/2005 | Marsh et al. | |

(Continued)

FOREIGN PATENT DOCUMENTS

| DE | 10053276 | 1/2002 |
|---|---|---|
| EP | 1414078 B1 | 4/2004 |

(Continued)

OTHER PUBLICATIONS

Dunn et al., "Rethinking Multifunction in Three Dimensions for Miniaturizing Electrical Energy Storage", Fall 2008, The Electrochemical Society Interface.

(Continued)

*Primary Examiner* — Mark F Huff
*Assistant Examiner* — Monique Wills
(74) *Attorney, Agent, or Firm* — Lumen Patent Firm

(57) ABSTRACT

Improved energy storage is provided by exploiting two physical effects in combination. The first effect can be referred to as the All-Electron Battery (AEB) effect, and relates to the use of inclusions embedded in a dielectric structure between two electrodes of a capacitor. Electrons can tunnel through the dielectric between the electrodes and the inclusions, thereby increasing the charge storage density relative to a conventional capacitor. The second effect can be referred to as an area enhancement effect, and relates to the use of microstructuring or nano-structuring on one or both of the electrodes to provide an enhanced interface area relative to the electrode geometrical area. Area enhancement is advantageous for reducing the self-discharge rate of the device.

15 Claims, 8 Drawing Sheets

(56) References Cited

U.S. PATENT DOCUMENTS

| | | |
|---|---|---|
| 7,057,881 B2 | 6/2006 | Chow et al. |
| 7,193,261 B2 | 3/2007 | Ilyanok |
| 7,208,802 B2 | 4/2007 | Shimizu et al. |
| 7,265,406 B2 | 9/2007 | Kellar et al. |
| 7,268,411 B2 | 9/2007 | Shimizu et al. |
| 7,295,419 B2 | 11/2007 | Chow et al. |
| 7,323,398 B2 | 1/2008 | Akatsu |
| 7,365,395 B2 | 4/2008 | Stumbo et al. |
| 7,428,137 B2 | 9/2008 | Dowgiallo, Jr. |
| 7,466,536 B1 | 12/2008 | Weir et al. |
| 7,575,978 B2 | 8/2009 | Kraus et al. |
| 7,662,731 B2 * | 2/2010 | Itoh et al. ............ 438/795 |
| 7,687,876 B2 | 3/2010 | Kabir |
| 7,750,869 B2 | 7/2010 | Mosallaei |
| 7,763,511 B2 | 7/2010 | Majhi et al. |
| 2006/0007633 A1 | 1/2006 | Bhattacharyya |
| 2006/0164788 A1 | 7/2006 | Eisenring |
| 2006/0243655 A1* | 11/2006 | Striemer et al. ........ 210/490 |
| 2006/0279905 A1 | 12/2006 | Chow et al. |
| 2007/0007576 A1 | 1/2007 | Kim et al. |
| 2007/0121274 A1 | 5/2007 | Talvacchio et al. |
| 2008/0062614 A1 | 3/2008 | Goia |
| 2008/0094775 A1 | 4/2008 | Sneh et al. |
| 2008/0180883 A1 | 7/2008 | Palusinski et al. |
| 2009/0047453 A1 | 2/2009 | Folaron et al. |
| 2009/0090999 A1 | 4/2009 | Carver |
| 2009/0096004 A1 | 4/2009 | Kawabata et al. |
| 2009/0103235 A1 | 4/2009 | Oh |
| 2009/0124483 A1 | 5/2009 | Lin et al. |
| 2009/0195961 A1 | 8/2009 | Eisenring |
| 2010/0068505 A1 | 3/2010 | Hartmut et al. |
| 2010/0090663 A1 | 4/2010 | Pappas et al. |
| 2010/0178543 A1* | 7/2010 | Gruner et al. ............. 429/121 |
| 2010/0226066 A1 | 9/2010 | Sweeney et al. |
| 2011/0275005 A1* | 11/2011 | Zhu et al. .............. 429/482 |

FOREIGN PATENT DOCUMENTS

| | | |
|---|---|---|
| WO | WO 2008/071369 | 6/2008 |
| WO | WO 2008/100304 | 8/2008 |
| WO | WO 2008/118422 | 10/2008 |
| WO | WO 2010/023575 | 3/2010 |

OTHER PUBLICATIONS

Garcia Del Muro et al., "Metallic nanoparticies embedded in a dielectric matrix: growth mechanisms and percolation", 2008, Art. ID 475168, Journal of Nanomaterials.

Merrill et al., "Effective medium theories for artificial materials composed of multiple sizes of spherical Inclusions in a host continuum", 1999, pp. 142-148, IEEE Trans. Antennas and Propagation v47n1.

Dupree et al., "The electronic properties of small metal particles: The electric polarizabllity", 1972, pp. 408-414, J. Phys. C: Solid State Physics, v5.

\* cited by examiner

ALL-ELECTRON BATTERY HAVING AREA-ENHANCED ELECTRODES

CROSS REFERENCE TO RELATED APPLICATIONS

This application claims the benefit of U.S. provisional patent application 61/211,746, filed on Apr. 1, 2009, entitled "Architecture of high-performance all-electron battery", and hereby incorporated by reference in its entirety.

This application also claims the benefit of U.S. provisional patent application 61/211,745, filed on Apr. 1, 2009, entitled "Energy storage in materials of different bandgaps", and hereby incorporated by reference in its entirety.

This application also claims the benefit of U.S. provisional patent application 61/274,866, filed on Aug. 20, 2009, entitled "Nanowire architecture all-electron battery", and hereby incorporated by reference in its entirety.

GOVERNMENT SPONSORSHIP

This invention was made with Government support under contract number W911NF-07-2-0027 awarded by the US Army Research Office. The Government has certain rights in this invention.

FIELD OF THE INVENTION

This invention relates to energy storage.

BACKGROUND

Energy storage is a crucial component of a large number and variety of electronic devices, particularly for mobile devices and vehicles. Energy storage devices have been based on a wide variety of physical effects. For example, electric fields can be employed to store energy in capacitors, and chemical reactions (involving ion motion) can be employed to store energy in batteries. However, energy storage in a capacitor can be limited by the device geometry (e.g., 2-D capacitor plates having limited area), and batteries can have a slow response time due to the ion motion inherent in electrochemical reactions.

Battery powered devices such as hybrid or electric vehicles are often limited in performance by the low energy stored per weight in batteries. Batteries have low storage density due to the large size and weight of the ions stored in the batteries. Slow ion transport in batteries also causes slow charge and discharge performance. Furthermore, the reliance of existing batteries on ionic transport causes high degradation rates of the batteries.

Accordingly, it would be an advance in the art to provide energy storage having higher energy density than a capacitor, faster charge/discharge than a battery and/or much longer lifetime than a battery.

SUMMARY

Improved energy storage is provided by exploiting two physical effects in combination. The first effect can be referred to as the All-Electron Battery (AEB) effect, and relates to the use of inclusions embedded in a dielectric structure between two electrodes of a capacitor. Electrons can tunnel through the dielectric between the electrodes and the inclusions, thereby increasing the charge storage density relative to a conventional capacitor. The second effect can be referred to as an area enhancement effect, and relates to the use of micro-structuring or nano-structuring on one or both of the electrodes to provide an enhanced interface area relative to the electrode geometrical area. Area enhancement is advantageous for reducing the self-discharge rate of the device.

Applications include electric vehicle energy storage (EV or PHEV battery), portable electronics (laptop, cell phone, etc.), and troop gear/weapons, where the advantages include high energy density storage (possibly greater than 250 Whr/kg), high power density storage (~$10^8$ W/kg), fast charge/discharge rate, and low degradation over time because there are no chemical reactions. Further advantages include no moving atoms/ions, and no risk of catastrophic, unsafe failure.

The present approach relates to a capacitor and an electron battery having very high storage density. Because the present approach relies on electrical energy stored as electrons instead of ions, small and light devices with high storage capacities are provided. Furthermore, electron transport allows for fast charge and discharge. The present solid-state devices can also have improved lifetime relative to existing energy storage devices. In this approach, energy storage is via electrons in bulk, as opposed to surface charges (e.g., conventional capacitors) or ions (e.g., batteries).

BRIEF DESCRIPTION OF THE DRAWINGS

FIG. 10b shows I-V data for the control structure of FIG. 10a.
FIGS. 11b-f show experimental data from the test structure of FIG. 11a.

DETAILED DESCRIPTION

Figure 1:
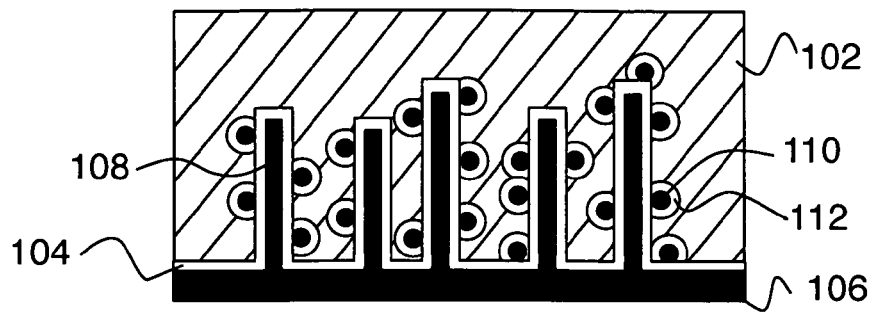
FIG. 1 shows an embodiment of the invention.

FIG. 1 shows an embodiment of the invention. In this example, an electrode 106 includes micro-structured or nano-structured features, one of which is referenced as 108. These electrode features provide an increased interfacial area (i.e., active area) relative to the electrode geometrical area. An insulating layer 104 is disposed on top of electrode 106. Inclusions are disposed on top of insulating layers 104. One of these inclusions is referenced as 110. The inclusions are surrounded by insulating layers, one of which is referenced as 112. A second electrode 102 is disposed such that a dielectric structure is disposed between the electrodes. In this example, the dielectric structure includes layers 104 and 112. The inclusions are disposed in this dielectric structure.

The inclusions are capable of transferring electrons to or from at least one of the electrodes by tunneling through the dielectric structure. Energy can be stored by establishing a charge separation between the inclusions, and energy can be provided by using this charge separation as an energy source.

Figure 2:
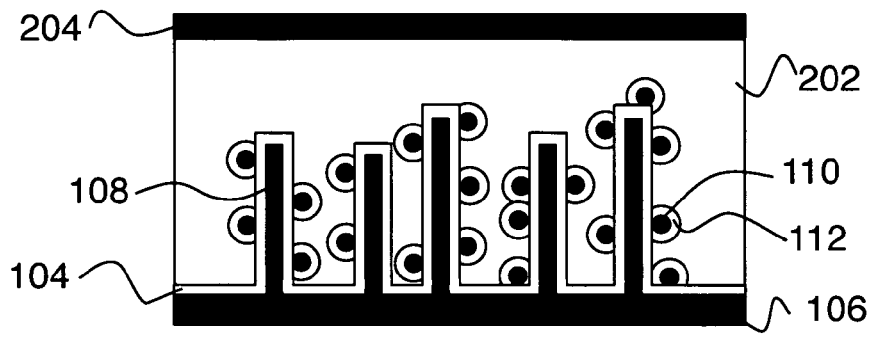
FIG. 2 shows another embodiment of the invention.
Figure 3:
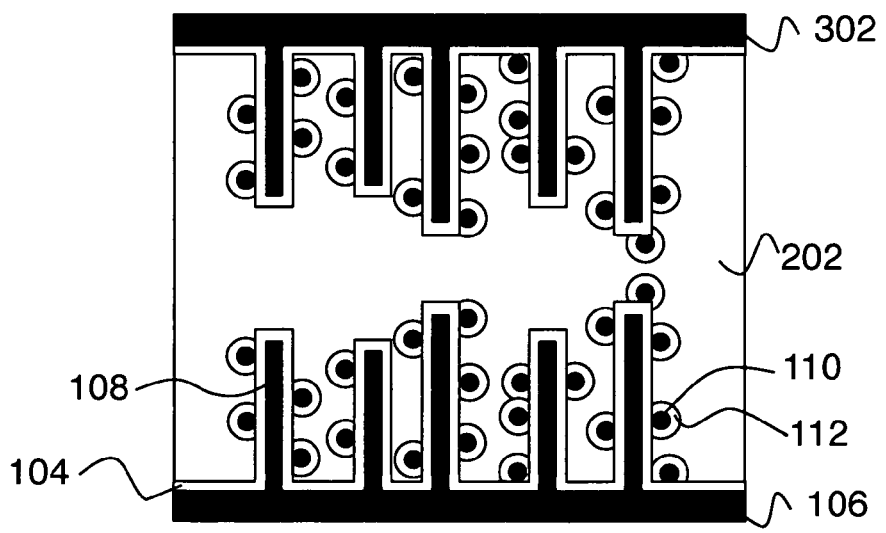
FIG. 3 shows a further embodiment of the invention.

FIGS. 2 and 3 show some alternative geometrical possibilities. More specifically, the example of FIG. 2 is like the example of FIG. 1, except that the interdigitated electrode 102 of FIG. 1 is replaced with a planar electrode 204 on FIG. 2, and the dielectric structure of FIG. 2 includes a dielectric filler region 202. The example of FIG. 3 is like the example of FIG. 2, except that the top electrode 302 on FIG. 3 is nanostructured and there are also inclusions near this electrode. Several layers of inclusions surrounded by dielectric layers may be disposed on top of one or both electrodes.

As indicated above, the point of micro-structuring or nano-structuring one or both electrodes of the device is to provide an electrode area enhancement. The purely geometric effect can be parameterized by the area enhancement ratio $a=A_i/A_g$, where $A_i$ is the interfacial area (i.e. active area) and $A_g$ is the geometrical area. The capacitance will increase proportionally to the area enhancement factor:

$$C = \epsilon\epsilon_0 A_i/d \in \epsilon_0 \alpha A_g/d \quad (1)$$

One possible embodiment of a nanowire electrode all electron battery uses conductive NiSi nanowires on the electrodes to increase the interfacial area, although it is understood that any conductive material would suffice. The NiSi nanowire growth process is well understood and can produce an area enhancement factor of $a\sim 50\text{-}100$.

An advantage of nanostructured electrodes is that it will bring down cost, since the cost of fabricating the AEB scales with the geometric area deposited, but with nanostructured electrodes, the energy density per geometric area will be higher by a factor of a. Preferably, the area enhancement factor is 1.5 or more. More preferably, this factor is 5 or more, and still more preferably, this factor is 10 or more.

Another advantage of using nanostructured electrodes is that the self-discharge rate will be lower by a factor that scales exponentially with a. The AEB is inherently suited for delivering high power density, since thin tunneling layers permit fast charge/discharge. A naively engineered AEB would suffer from unreasonably high rates of self-discharge for the same reason.

Assuming there are no deleterious side reactions and self-discharge occurs only by leakage current by discharge through the shunt resistance of the capacitor, the leakage current can be calculated given the resistivity of the material. The result is that the amount of charge stored on a parallel plate capacitor decays exponentially with time according to:

$$Q(t) = Q_0 e^{-t/RC} = Q_0 \exp\left[-\frac{t}{\rho\epsilon\epsilon_0}\right] \quad (2)$$

where $Q_0$ is the initial charge, t is the time, C is the capacitance, and R is the resistance of the dielectric of resistivity $\rho$ and permittivity $\epsilon$. If we nanostructure the electrode, we can attain an area enhancement factor of up to $a=A_i/A_g\sim 10^2$ as discussed above. In this case, the product RC becomes $$RC = \left[\frac{\rho d}{A_g}\right]\left[\frac{\epsilon\epsilon_0 A_i}{d}\right] = a\rho\epsilon\epsilon_0 \quad (3)$$

where d is the thickness separating the electrodes. Therefore, the charge loss in terms of a is given by:

$$Q(t) = Q_0 e^{-t/RC} = Q_0 \exp\left[-\frac{t}{a\rho\epsilon\epsilon_0}\right] \quad (4)$$

To meet a specification of no more than 15% self-discharge per month, the product $a\rho\epsilon$ must be greater than $10^{18}$ $\Omega\cdot$m. As the resistivity of insulators such as $SiO_2$ is approximately $10^{14}$ $\Omega\cdot$m, we conclude that ac must be greater than 10000. As discussed above, nanowire electrodes allow an area enhancement of $a\sim 10^2$. Therefore, the self-discharge requirement implies $\epsilon$ must be at least $10^2$. Permittivity values this high or higher are readily attainable, whereas a permittivity of $10^4$ or more is difficult to obtain and tends to occur only in materials with other disadvantageous properties such as low breakdown strength, low temperature tolerance, and low energy density.

Atomic layer deposition (ALD) is well suited to coat high aspect ratio structures and complex geometries, whereas PVD techniques tend to be limited by line-of-sight deposition. Therefore, chemical vapor deposition techniques such as ALD are the preferred deposition mechanism for the layer of dielectric that interfaces with microstructured electrodes.

A noteworthy feature of the present device is that it tends to be large compared to microelectronic switching devices, such as transistors, although still small relative to conventional batteries. Such size follows from its purpose of storing energy. Preferably, the electrodes each have a geometrical area of 1 $\mu m^2$ or greater. Another typical feature of embodiments of the invention is operation at relatively high voltages. Preferably, charge separation between the inclusions is established by application of a voltage of 5V or more between the electrodes. Another noteworthy feature of some embodiments of the invention is that AEBs are preferably two terminal devices, where the only external device terminals are the electrodes on either side of the dielectric structure.

Embodiments of the invention can provide high charge storage density. To quantify this point, it is convenient to define the volume averaged charge separation density as follows: In a charged device having N extra electrons near one of its terminals and N missing electrons (e.g. holes) near the other terminal, and a volume between the terminals of V, the volume averaged charge separation density is N/V. Preferably, the volume averaged charge separation density can be $10^{-4}$ $e^-/nm^3$ or greater when a charge separation is present between the inclusions (i.e., when the AEB is in an energy storing state).

Important design parameters for AEBs include some or all of the following parameters: electrode area enhancement factors, the spacing between electrodes and inclusions, the spacing between inclusions, the size, shape, and number density of inclusions, the tunneling energy barrier between electrodes and inclusions, the tunneling energy barrier between inclusions, dielectric constants, and work functions. The charge and discharge rates and storage capacities of the devices can be selected by appropriate geometrical design and material choice. Charge and discharge rates depend on the gaps between inclusions and the dielectric constant of the dielectric material, therefore the rates can be altered by changing the distances between inclusions, and/or the dielectric constant. Charge and discharge rates further depend upon the electron affinity of the dielectric material and of the inclusions.

Figure 4:
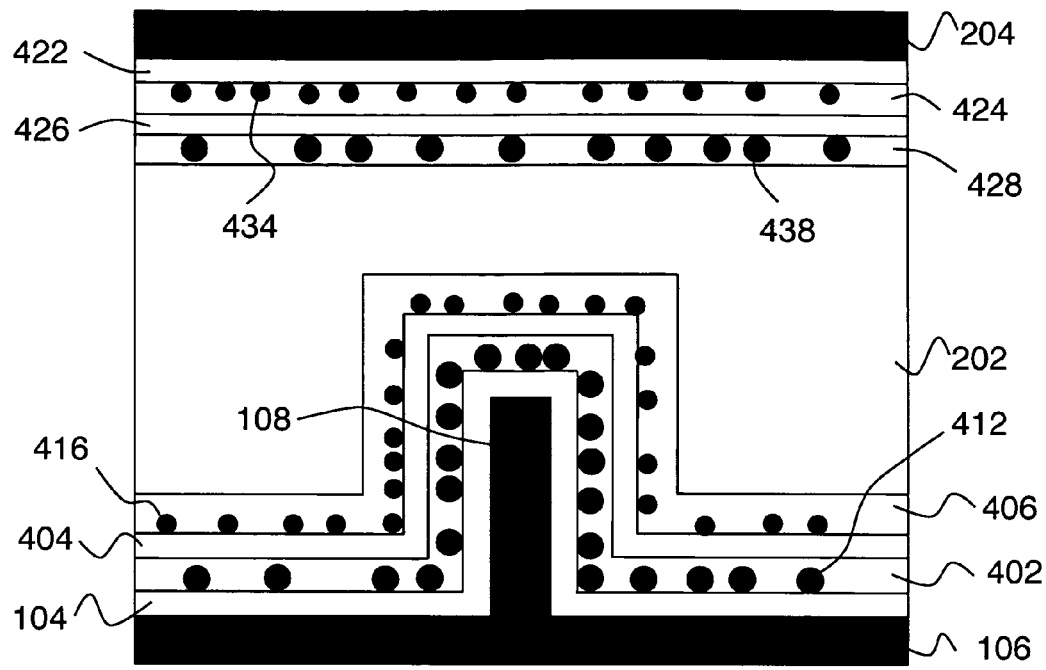
FIG. 4 shows a detail view of an embodiment of the invention.

FIG. 4 shows a detail view of an embodiment of the invention. In this example, the inclusions are organized as functional layers disposed in or on the dielectric structure. More specifically, functional layers 402 and 406 are disposed near a micro-structured electrode 106, and functional layers 424 and 428 are disposed near a planar electrode 204. Insulating layers 422 and 104 separate functional layers 424 and 402 from electrodes 204 and 106 respectively. An insulating barrier layer 426 is disposed between functional layers 424 and 428. An insulating barrier layer 404 is disposed between functional layers 402 and 406. Thus, the dielectric structure in this example includes multiple dielectric layers (i.e., layers 104, 404, 202, 422, and 426). Functional layers can be metallic or be semiconductors and can contain embedded inclusions having an electron affinity that is higher than the electron affinity of the dielectric structure.

The inclusions can be arranged to provide a work function gradient for the inclusions, e.g., by providing an inclusion size and/or material composition gradient. The functional layers can include different materials having different work functions, and can be disposed to form a Fermi level gradient. The functional layers can include one or more materials having an electron affinity that is lower than an electron affinity of part or all of the dielectric structure.

This example includes, as a preferred feature, vertical stacking of inclusions. Each of the functional layers is capable of storing an amount of charge by itself, therefore the device with functional layers is capable of storing a larger amount of charge. Since the voltage of these functional layers stacked in series is additive, and the energy density scales with the square of the voltage, a substantially higher energy density can be achieved.

In one embodiment, an energy storage device has inclusions of varying sizes. Preferably, large inclusions are placed near one electrode and smaller inclusions are placed near an opposing electrode. Charge is preferentially stored in the larger inclusions. The gradient in the size distribution allows polarization of the inclusions, even when the cell is neutral (e.g., a larger inclusion can be polarized due to its proximity to a smaller inclusion). When the device is charged, the excess charge is preferentially contained in the larger inclusion, thereby increasing the stored charge. It is noted that the inclusions can have a wide range of sizes. In particular, the larger inclusions can be nanowires, quantum wells, and/or bulk inclusions, while the smaller inclusions can be as small as an individual atom.

In another embodiment, the inclusions are made of different materials. Additionally, a first inclusion can be made from a material with a greater work function than a second inclusion. Electron transfer results from the Fermi level difference between materials in proximity, so a greater polarization can be achieved with a greater difference in Fermi level.

These principles can be better appreciated in view of the following more detailed example relating to FIG. 4. In this specific example, a size gradient is employed. Inclusions in functional layer 402, one of which is referenced as 412, are larger than inclusions in functional layer 406 (one of which is referenced as 416). Similarly, inclusions in functional layer 428, one of which is referenced as 438, are larger than inclusions in functional layer 424 (one of which is referenced as 434). These size gradients provide a continuous change in work function across functional layers 424 and 428, and across functional layers 402 and 406 because work function decreases as size decreases for quantum-confined inclusions.

In this example, the thickness of functional layers 402, 406, 428 and 424 is preferably in a range from 0.3 nm to 300 μm. Dielectric filler layer 202 preferably has a thickness in a range of 1 nm to 500 μm and having a relatively high electron affinity, relatively high bandgap and relatively high breakdown voltage. The bandgap of layer 202 may be above 1 eV and is preferably above 4 eV. The breakdown field for layer 202 is preferably above 1 MV/cm and more preferably above 3 MV/cm.

Electrode 204 preferably has a relatively small work function $\phi_s$ (i.e., $\phi_s$ below 4 eV and more preferably below 3 eV). Some exemplary materials useful for electrode 204 include but are not limited to: Zn, Li, Na, Mg, K, Ca, Rb, Sr, Ba, Cs, doped diamond and Y. Electrode 106 is micro-structured as described above and has a relatively large work function $\phi_l$ (i.e., $\phi_l$ above 4.5 eV and more preferably above 5.5 eV). Some exemplary materials useful for electrode 106 include but are not limited to: Au, Pt, W, Al, Cu, Ag, Ti, Se, Ge, Pd, Ni, Co, Rh, Ir and Os.

Inclusion size gradients are highly polarizable using high density of state (DOS) materials including but not limited to: Ni, Pt, Cu, Ag, Au and Ir as inclusion materials. Inclusions are preferably chemically stable in the dielectric structure material (e.g. doesn't oxidize if the matrix material is an oxide). Some examples of materials useful for the dielectric layers include, but are not limited to: $Al_2O_3$, Si, $TiO_2$, Ti-nitride, Ti-oxynitride, Ge, ZnO, $ZrO_2$, $HfO_2$, $SiO_2$, $Si_3N_4$, $Y_2O_3$, $BaTiO_3$, SrO, $SrTiO_3$, and mixtures or combinations thereof. Materials useful for the inclusions include metals such as Pt, Au, Ni, Ag, W, Ti, Al, Cu, Pd, Cs, Li, Na, K, Y, Sr and Ba. Further examples of materials useful for the inclusions include low bandgap semiconductors such as PbSe, PbS, ZnS, CdSe, CdS, ZnSe, Ge, Si, Sn and conductive oxides such as $RuO_2$. Insulating layer 202 can be made from materials including but not limited to: ZnS, $TiO_2$, $Al_2O_3$, $ZrO_2$, $Y_2O_3$, $HfO_2$, $Si_3N_4$, $SiO_2$, other oxides, nitrides, sulfides, and selenides.

Figure 5:
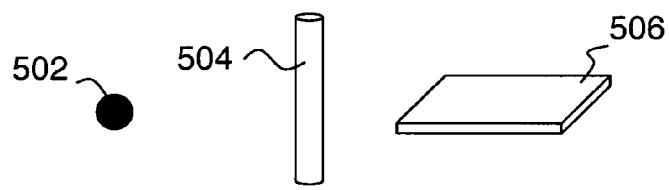
FIG. 5 shows several kinds of inclusion suitable for use in embodiments of the invention.

FIG. 5 shows several kinds of inclusion suitable for use in embodiments of the invention. More specifically, inclusions can be bulk materials, or they can be quantum confined in one dimension (quantum well 506), two dimensions (quantum wire 504), and/or three dimensions (quantum dot 502). The size below which quantum confinement effects become significant depends on the material, but it is typically about 2-10 nm in metals and about 5-40 nm in semiconductors. Thus metallic inclusions having size greater than 10 nm in all three dimensions are likely to effectively have bulk material properties. Similarly, semiconductor inclusions having size greater than 40 nm in all three dimensions are likely to effectively have bulk material properties. The use of quantum dot inclusions (e.g., metal dots having all dimensions 10 nm or less and/or semiconductor dots having all dimensions 40 nm or less), as in the preceding examples, is preferred but not required.

Figures 6A, 6B:
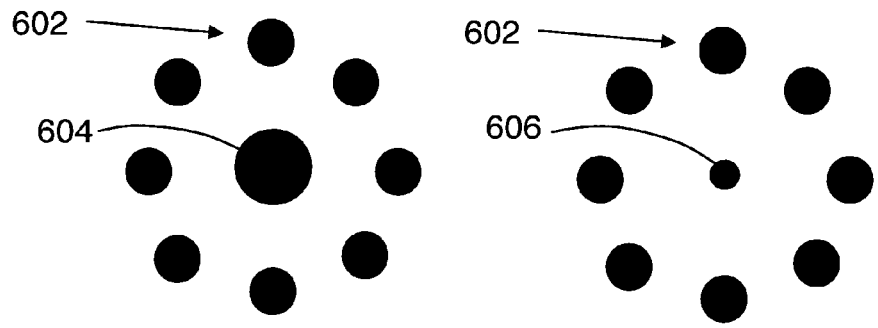
FIGS. 6a-b shows examples of the use of inclusions of different size in connection with embodiments of the invention.

FIGS. 6a-b shows examples of the use of inclusions of different size in connection with embodiments of the invention. In the example of FIG. 6a, a relatively large inclusion 604 is surrounded by smaller inclusions 602. In the example of FIG. 6b, a relatively small inclusion 606 is surrounded by larger inclusions 602. As indicated above, such size gradients allow for the creation of helpful work function gradients in AEBs.

Figure 7A:
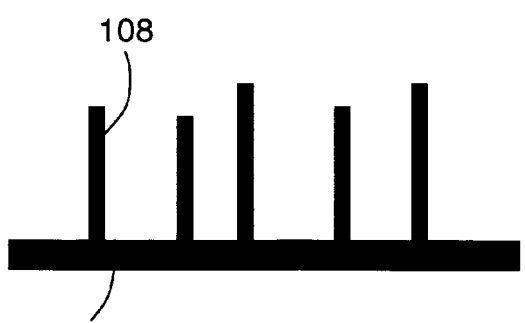
FIGS. 7a-e show a first fabrication sequence for an embodiment of the invention.

FIGS. 7a-e show a first fabrication sequence for an embodiment of the invention. FIG. 7a shows the results of the first step of this example, which is formation of vertical metal nanowires (one of which is referenced as 108) on electrode 106. Suitable fabrication methods include, but are not limited to: Vapor-Liquid-Solid (VLS) growth techniques, optical and/or e-beam lithography, nanosphere lithography, and electroplating through a porous membrane (e.g., a polycarbonate track-etched membrane). VLS techniques start with a solid catalyst particle and a vapor reactant. The vapor lands on the solid, diffuses through it, and forms a solid beneath the catalyst particle, resulting in a wire of diameter approximately equal to the catalyst diameter.

Figure 7D:
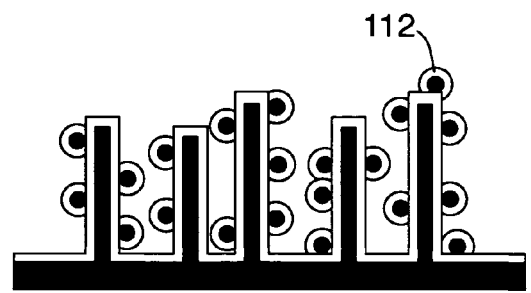
Figure 7B:
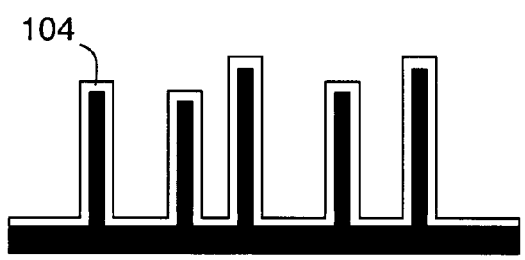

FIG. 7b shows the result of the second step of this example, which is deposition of an insulating layer 104. Any insulator deposition method can be employed, although chemical vapor deposition is preferred as indicated above.

Figure 7E:
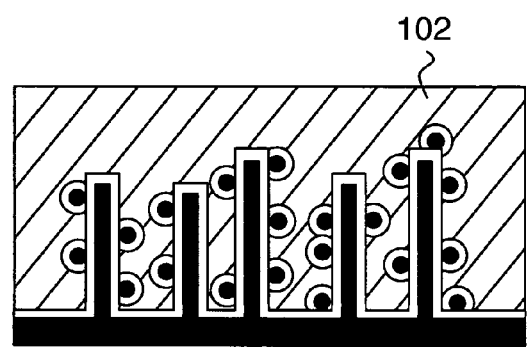
Figure 7C:
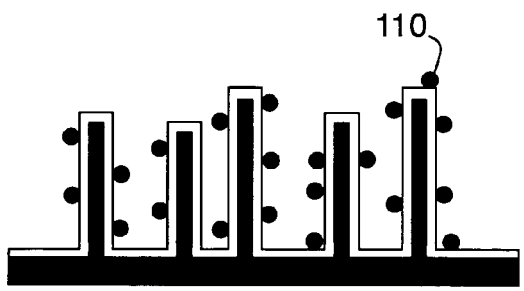

FIG. 7c shows the result of the third step of this example, which is deposition of quantum dots, one of which is referenced as 110. Any quantum dot deposition technique can be employed, including but not limited to vapor deposition, self-assembly, and processing of colloidal quantum dots. Optionally, the second and third steps can be repeated one or more times to form a multi-layered structure (e.g., as in the example of FIG. 4).

FIG. 7d shows the result of the fourth step of this example, which is deposition of an insulating passivation layer on top of the quantum dots, part of which is referenced as 112. Any insulator deposition method can be employed, although chemical vapor deposition is preferred as indicated above.

FIG. 7e shows the result of the fifth step of this example, which is deposition of metal to form an interdigitated top electrode 102. Any metal deposition method can be employed, including but not limited to: vapor phase deposition and electroless plating.

Figure 8A:
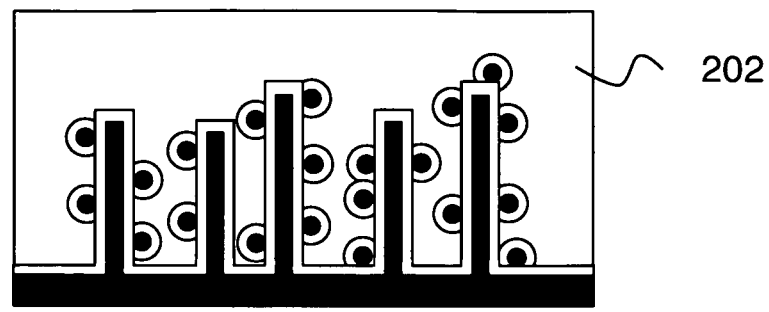
FIGS. 8a-b show final steps of a second fabrication sequence for an embodiment of the invention.
Figure 8B:
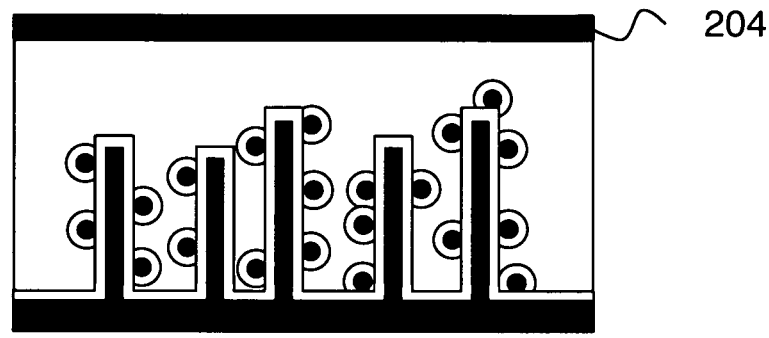

FIGS. 8a-b show final steps of a second fabrication sequence for an embodiment of the invention. In this second sequence, the first four steps are as described in connection with FIGS. 7a-d. FIG. 8a shows the result of the fifth step of this example, which is deposition of a dielectric filler region 202 on the structure of FIG. 7d. Any insulator deposition method can be employed, although chemical vapor deposition is preferred as indicated above. Optionally, the steps of FIGS. 7d and 8a can be combined into a single insulator deposition step. FIG. 8b shows the result of the sixth step of this example, which is deposition of an electrode 204 on top of the dielectric filler region 202. Any method for depositing metal electrodes on an insulator can be employed.

Figure 9:
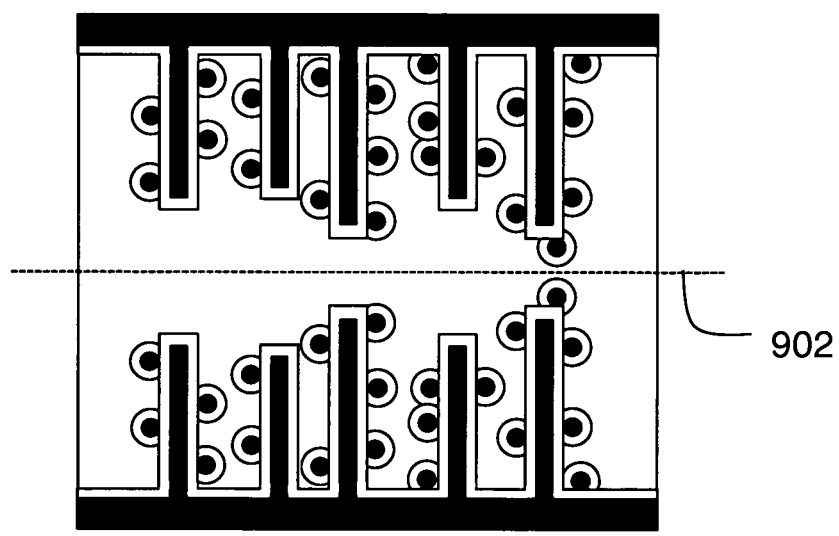
FIG. 9 shows the final step of a third fabrication sequence for an embodiment of the invention.

FIG. 9 shows the final step of a third fabrication sequence for an embodiment of the invention. In this third sequence, the first five steps are as described in connection with FIGS. 7a-d and 8a. FIG. 9 shows the result of the sixth step of this example, which is performing insulator to insulator bonding of two structures as in FIG. 8a along a bond line 902 to provide an AEB having two nano-structured electrodes. Suitable bonding methods include but are not limited to: sintering, heat treatment with a low melting point metal (which can be regarded as analogous to low temperature soldering), and vapor phase deposition.

Figure 10A:
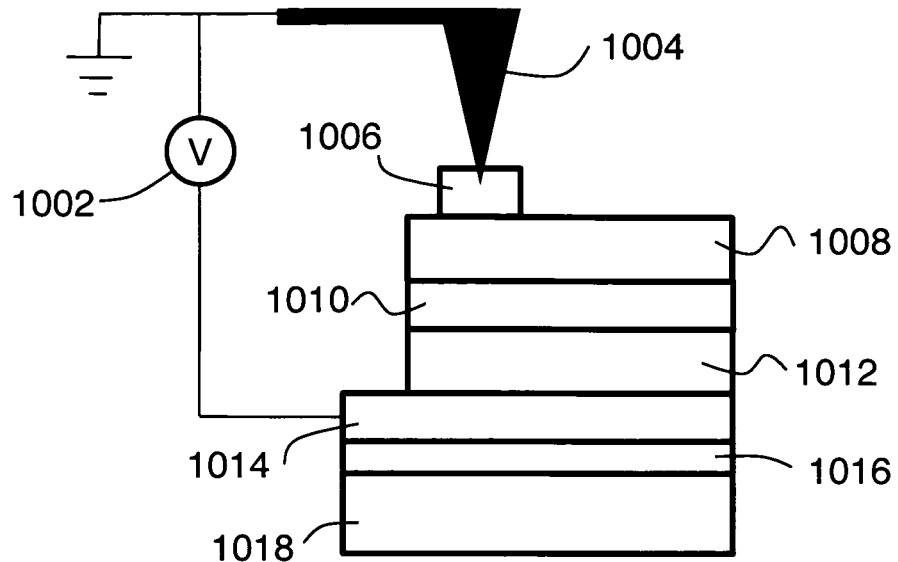
FIG. 10a shows a control structure for experiments relating to principles of the invention.

FIG. 10a shows a control structure for experiments relating to principles of the invention. In this example, a voltage source 1002 provides input to a control sample via a Pt/Ir Atomic Force Microscope (AFM) tip 1004. The control sample includes a quartz substrate 1018, a Cr layer 1016 and a Pt layer 1014 which together form the bottom electrode of this sample, a 10 nm thick $ZrO_2$ insulating layer 1012, a 10 nm thick conductive Pt layer 1010, a 10 nm thick $ZrO_2$ insulating layer 1008, and a Pt top electrode 1006. This control structure is basically two capacitors in series.

Figure 10B:
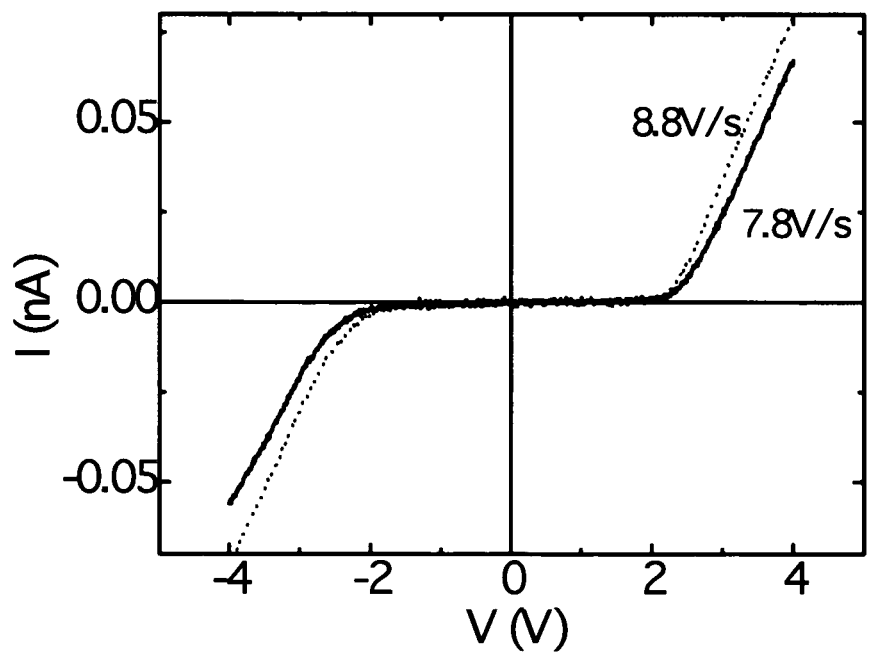

FIG. 10b shows I-V data for the control structure of FIG. 10a. The solid line shows results for a voltage sweep rate of 7.8 V/s, and the dotted line shows results for a voltage sweep rate of 8.8 V/s. As expected, more current flows at the higher sweep rate, because capacitor current I is given by I=CdV/dt, where C is the capacitance.

Figure 11A:
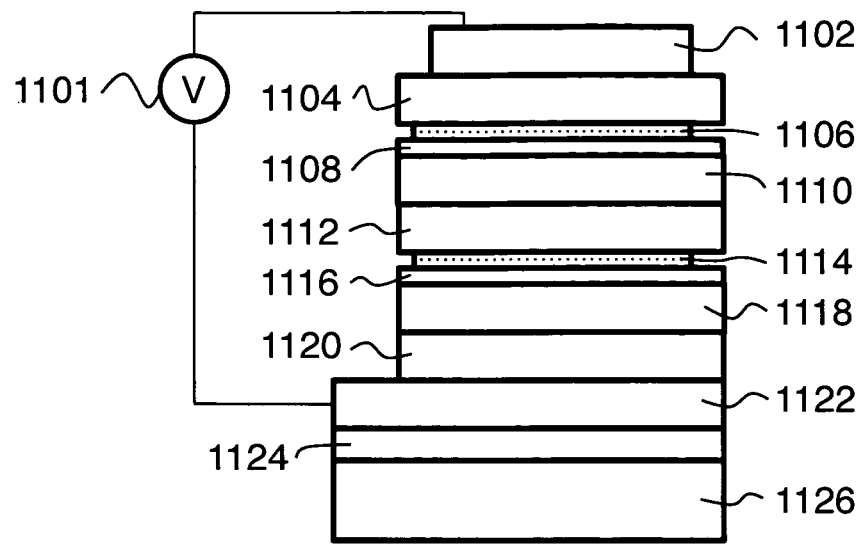
FIG. 11a shows a test structure relating to principles of the invention.

FIG. 11a shows a test structure relating to principles of the invention. In this example, a voltage source 1101 provides input to a test sample via a Pt/Ir AFM tip (not shown). The test sample includes a quartz substrate 1126, a Cr layer 1124 and a Pt layer 1122 which together form the bottom electrode of this sample, a 10 nm thick $ZrO_2$ insulating layer 1120, a 10 nm thick conductive Pt layer 1118, a 2 nm thick $ZrO_2$ insulating layer 1116, a 10× Pt quantum dot layer 1114, a 10 nm thick $ZrO_2$ insulating layer 1112, a 10 nm thick conductive Pt layer 1110, a 2 nm thick $ZrO_2$ insulating layer 1108, a 10× Pt quantum dot layer 1106, a 10 nm thick $ZrO_2$ insulating layer 1104, and a Pt top electrode 1102. Here, "10×" indicates that 10 ALD cycles of Pt were performed to form Pt islands of on average 1.7 nm in diameter with a number density of $3.2 \times 10^{12}$ particles per $cm^2$. This experiment demonstrates AEB behavior that is relevant here, even though the electrodes of this test structure are planar as opposed to be being micro-structured or nano-structured.

Figure 11B:
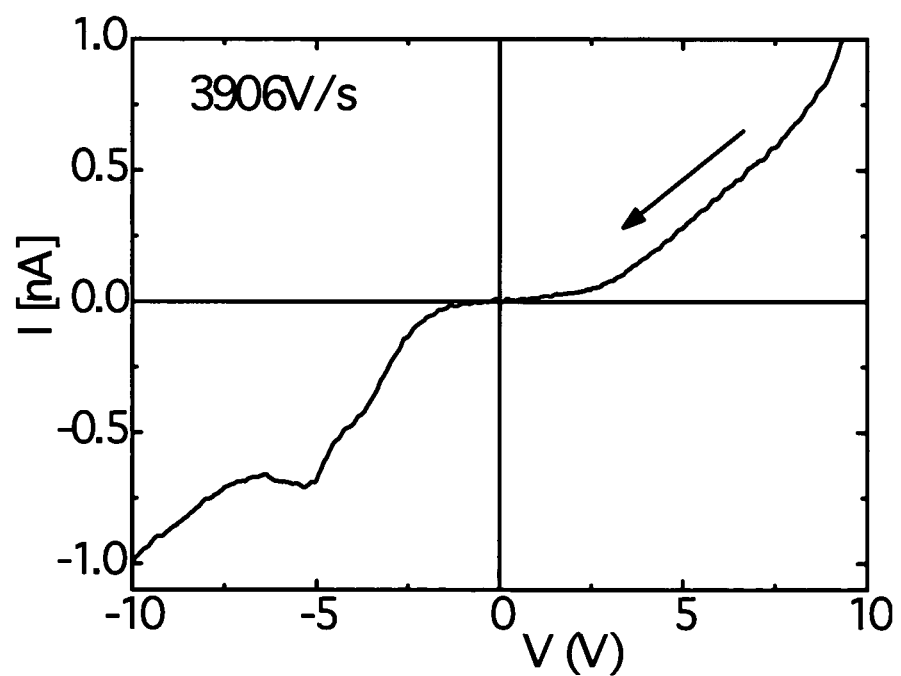
Figure 11C:
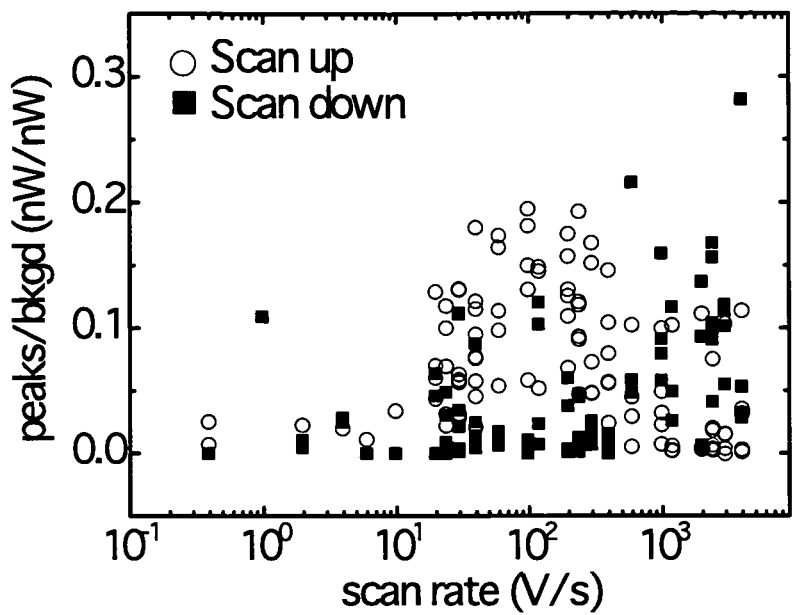
Figure 11D:
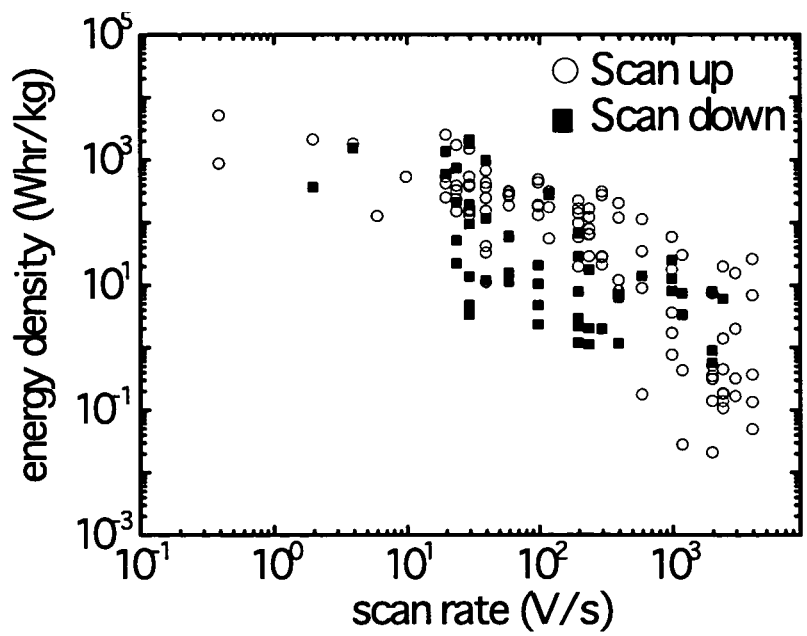

The experimental signature of the AEB effect is a peak in the I-V curve obtained during a sweep of applied voltage. FIG. 11b shows a representative example. In this example, a substantial I-V peak is seen as the voltage is swept from 10 V to −10 V at a sweep rate of 3906 V/s. This peak is attributed to the release of charge that was stored in the device as a result of bringing it to the initial condition of 10 V bias. Quantitative analysis of such I-V peaks provides the basis for experimental estimates of power and energy storage density. More specifically, FIG. 11c shows raw peak data for the structure of FIG. 11a, and FIG. 11d shows corresponding energy density results.

Figure 11E:
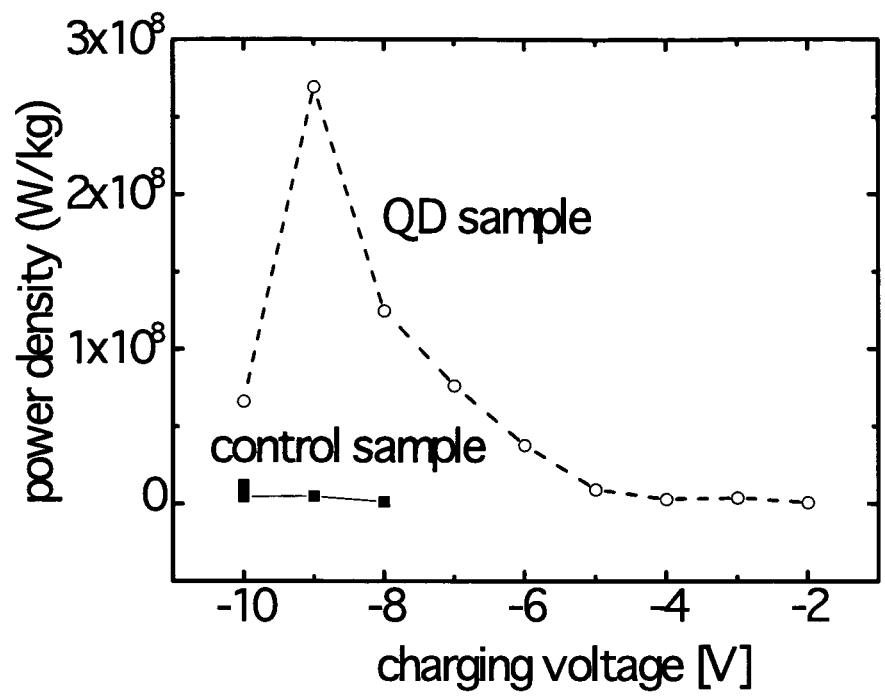
Figure 11F:
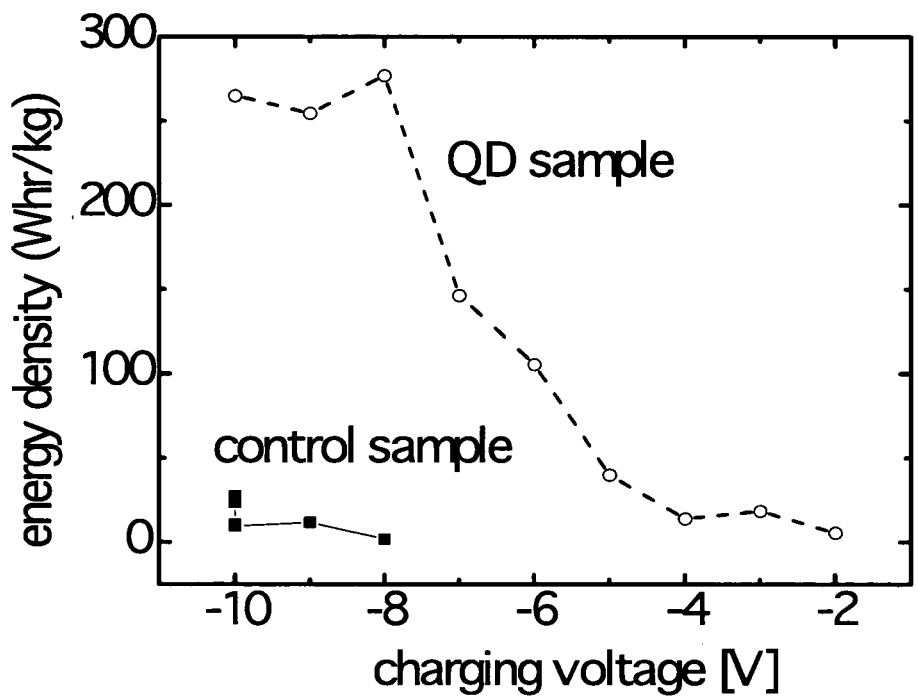

FIGS. 11e and 11f show comparative energy and power density results for the control structure of FIG. 10a and the test structure of FIG. 11a. The "charging voltage" on these plots is defined as follows. Voltage sweeps were performed from X volts to 10 volts, where X is the charging voltage and is negative. The voltage range from X to 0 volts acts to charge the device, while the voltage range from 0 to 10 V is the discharge range. Stored energy/power is seen to increase on these plots as the charging voltage is made more negative (i.e., the device is more completely charged).

The preceding description has been by way of example as opposed to limitation, and many variations of the given examples can be employed to practice the invention. For example, practice of the invention does not depend critically on the fabrication sequences and/or methods employed. As another example, the size gradient of inclusions may be combined with a material gradient of inclusions, and they may be arranged in any fashion. As a further example, the inclusions may have any shape such as a sphere, cone, pyramid, or approximately two-dimensional shape such as a triangle or circle. As yet another example, many layers of inclusions, each inclusion being surrounded by a dielectric layer, may be included on one or both electrodes. In another example, a nanostructured template can be used to provide the conductive nanostructured electrode(s) rather than directly making the electrode nanostructured by nanowire growth. For example, an insulating nanostructured material such as anodic alumina can be used as a template, and electrodes can be formed by depositing a conductive electrode layer on such a micro- or nano-structured template.

The invention claimed is:

1. An electrostatic solid-state energy storage device comprising:
    a first electrode;
    a second electrode;
    a dielectric structure disposed between said first and second electrodes; and two or more inclusions disposed in said dielectric structure and capable of transferring electrons to or from at least one of said electrodes by tunneling through said dielectric structure;

wherein at least one of said first and second electrodes is vertically micro-structured to provide a greater active area than geometrical area;

wherein said device is capable of storing energy by establishing a charge separation between said inclusions, and wherein said device is capable of providing energy by using said charge separation as an energy source.

2. The device of claim 1, wherein at least one of said first and second electrodes has an active area to geometrical area ratio of 1.5 or more.

3. The device of claim 1, wherein said device is a two-terminal device having only said first and second electrodes as external terminals.

4. The device of claim 1, wherein said first and second electrodes each have a geometrical area of 1 $\mu m^2$ or greater.

5. The device of claim 1, wherein said charge separation between said inclusions is established by application of a voltage of 5V or more between said first and second electrodes.

6. The device of claim 1, wherein a volume averaged charge separation density of said device when said charge separation is present is $10^{-4}$ $e^-/nm^3$ or greater.

7. The device of claim 1, wherein said inclusions are selected from the group consisting of: quantum well, quantum wire, quantum dot, and bulk material.

8. The device of claim 1, wherein said inclusions are arranged according to size to provide a smooth work function gradient of said inclusions.

9. The device of claim 1, wherein a first of said inclusions is surrounded by several others of said inclusions each having a smaller size than said first inclusion.

10. The device of claim 1, wherein a first of said inclusions is surrounded by several others of said inclusions each having a larger size than said first inclusion.

11. The device of claim 1, wherein some or all of said inclusions are organized as functional layers disposed in or on said dielectric structure.

12. The device of claim 11, wherein said functional layers comprise different materials having different work functions, and wherein said functional layers are disposed to form a Fermi level gradient.

13. The device of claim 11, wherein said functional layers comprise a material having an electron affinity that is lower than an electron affinity of part or all of said dielectric structure.

14. The device of claim 11, wherein two or more of said functional layers are arranged in a multi-layer stack and separated from each other by one or more barrier layers.

15. The device of claim 1, wherein said dielectric structure comprises two or more dielectric layers.

* * * * *